United States Patent [19]

Kim et al.

[11] Patent Number: 5,182,224
[45] Date of Patent: Jan. 26, 1993

[54] METHOD OF MAKING DYNAMIC RANDOM ACCESS MEMORY CELL HAVING A SDHT STRUCTURE

[75] Inventors: Jae W. Kim, Seoul; In S. Chung, Ichon-Uep, both of Rep. of Korea

[73] Assignee: Hyundai Electronics Industries Co., Ltd., Rep. of Korea

[21] Appl. No.: 641,621

[22] Filed: Jan. 16, 1991

Related U.S. Application Data

[62] Division of Ser. No. 407,886, Sep. 15, 1989, abandoned.

[30] Foreign Application Priority Data

Sep. 22, 1988 [KR] Rep. of Korea .................. 12241/88

[51] Int. Cl.$^5$ .......................................... H01L 21/70
[52] U.S. Cl. .......................................... 437/52; 437/47; 437/48; 437/60; 437/160; 437/164; 437/228; 437/919
[58] Field of Search ................. 357/5, 23.6, 51; 437/38, 47, 48, 52, 60, 191, 193, 195, 203, 228, 233, 235, 991, 160, 162, 164; 156/644

[56] References Cited

U.S. PATENT DOCUMENTS

| | | | |
|---|---|---|---|
| 3,887,993 | 7/1975 | Okada et al. | 437/41 |
| 4,356,623 | 11/1982 | Hunler | 437/44 |
| 4,366,613 | 1/1983 | Oguza et al. | 437/48 |
| 4,433,468 | 2/1984 | Kawamata | 437/193 |
| 4,569,701 | 2/1986 | Oh | 437/162 |
| 4,734,384 | 3/1988 | Tsuchiya | 437/52 |
| 4,782,036 | 11/1988 | Becker | 437/164 |
| 4,788,160 | 11/1988 | Hovemann et al. | 437/200 |
| 4,794,434 | 12/1988 | Pelley, III | 357/23.6 |
| 4,801,989 | 1/1989 | Taguchi | 357/23.6 |
| 4,810,666 | 3/1989 | Taji | 357/44 |
| 4,824,793 | 4/1989 | Richardson et al. | 437/162 |
| 4,873,205 | 10/1989 | Critchlow et al. | 357/23.6 |
| 4,890,145 | 12/1989 | Malhi | 357/23.6 |
| 4,894,696 | 1/1990 | Takeda et al. | 357/23.6 |

FOREIGN PATENT DOCUMENTS

| | | | |
|---|---|---|---|
| 0208660 | 9/1987 | Japan . | |
| 0229713 | 9/1988 | Japan | 437/164 |
| 2199696 | 7/1988 | United Kingdom . | |

*Primary Examiner*—Tom Thomas
*Attorney, Agent, or Firm*—Ladas & Parry

[57] ABSTRACT

A SDHT structured DRAM Cell with a P type silicon substrate and a P well region with a first trench formed into the P well region and a CVD oxide film layer formed on the wall of the first trench is disclosed. A second trench is formed in the bottom of the first trench. A capacitive oxide film layer is formed on the CVD oxide film layer of the first trench and on the second trench with a conducting material filling the trenches to form an inside charge storage electrode. A N MOSFET is formed on the P well region near the first trench with the N MOSFET having a soure N+ region and a drain N+ region, each including a LDD region.

3 Claims, 9 Drawing Sheets

METHOD OF MAKING DYNAMIC RANDOM ACCESS MEMORY CELL HAVING A SDHT STRUCTURE

CROSS REFERENCE

This application is a division of co-pending U.S. application Ser. No. 07/407,886 filed on Sep. 15, 1989, now abandoned disclosing and claiming only the subject matter disclosed initially in the parent application.

BACKGROUND OF THE INVENTION

Field of the Invention

This invention relates to a DRAM (Dynamic Random Access Memory) cell of highly integrated semiconductor storage device, and to a method for manufacturing the same, and more particularly to a DRAM cell having a SDHT (Side-Wall Doped Half-Vcc Plate Trench Capacitor) structure for increasing the capacitance of a capacitor and for decreasing the size of the DRAM cell, and to a method for its manufacture.

Retailed Application

A method for forming a selectively doped diffusion region using an oxide film and a nitride film layer on the trench is fully described in U.S. Ser. No. 07/394,380, entitled: a Doping Method Using an Oxide Film and a Nitride Film on the Trench Wall to Manufacture a Semiconductor Device and the Manufactured Device, filed on Aug. 16, 1989, and a Self Aligned Contact Process is fully described in U.S. Ser. No. 07/381,289, entitled: Dynamic Random Access Memory Cell and Method, filed on Jul. 18, 1989, said applications being expressly incorporated herein by reference as if fully set forth hereat.

INFORMATION DISCLOSURE STATEMENT

In the prior art DRAM cell having a SDT (Side-wall Doped Trench Capacitor) structure, since a high voltage of VBB as a capacitor plate bias, the same voltage as applied to the P type substrate, is applied to the P+ diffusion area formed on the side wall of the trench capacitor, the oxide film layer of the trench capacitor must be substantially thick to withstand the force of the electric field occurred between inside and outside electrode of the capacitor. However, in the prior art DRAM cell, there is a problem in that the capacitance of the capacitor decreases, as the thickness of oxide film layer increases. There is another problem in that the size of the cell increases since a contact mask should be utilized, as will be described.

That is, in case of implementing the bit line contact mask to connect the source N+ region and bit line and the SNC (Storage Node Contact) mask to connect the drain N+ region of the MOSFET and inside charge storing electrode, since a mismatch of the mask alignment occurs due to a limit in the precision of the apparatus used for the manufacturing process, and a minimum extra distance must be maintain to prevent current leakage at the area between the gate electrode and said mask, the drawbacks of increasing the total size of the cell become clear.

Accordingly, it is an object of the present invention to provide a method for manufacturing a DRAM cell having a SDHT structure which can increase the capacitance of the capacitor and reduce the size of the DRAM cell, in order to avoid the drawbacks set forth above.

According to the present invention, since the N+ diffusion region formed by diffusing N+ impurity into the side wall of the trench capacitor, VCC/2 can be applied to there apart from applying to the silicon substrate which is P type, thereby causing the thickness of the oxide film layer of the capacitor to be decreased as much as, for example 80 Angstroms.

Further, a larger capacitance of the capacitor per unit area according to the invention is obtained relative to the capacitor having a SDT structure of the prior art. Also, the use of the self-aligned contact process, instead of the mask process, to connect the source N+ region of the MOSFET to the bit line and to connect the drain N+ region to inside charge storage electrode of the trench capacitor, a highly integrated cell can be obtained.

The novel feature of the present invention may be understood from the accompanying description when taken in conjunction with the accompanying drawings.

BRIEF SUMMARY OF THE INVENTION

The present invention relates to a DRAM cell having a SDHT structure and to a method for its preparation. For purposes of summarizing the invention the DRAM cell of the present invention comprises a P type silicon substrate with a P well region having a first trench formed into the P well region. The first trench includes an outer wall, an inner wall, a top and a bottom. A CVD oxide film layer is formed on the inner surface of the wall of the first trench. A second trench extends from the bottom of the first trench through the P well region and into the P type silicon substrate and includes an outer wall and an inner wall. A capacitive oxide film layer is formed on the CVD oxide film layer of the first trench and on the inner surface of the wall of the second trench. Conducting material fills the first and the second trenches to form an inside charge storage electrode. An insulating oxide film layer is formed on a portion of the top of the conducting material filling the first and second trenches and onto a portion of the surface of the P well region adjacent the first trench. A N+ diffusion region extends from the outer surface of the wall of the second trench and into a portion of the P well region and a portion of the P type silicon substrate. A gate electrode line is formed on the insulating oxide film layer, with an oxide film spacer formed at each side of the gate electrode line. A first insulating layer is formed over the gate electrode line. A N MOSFET is formed on the P well region proximate the first trench with the N MOSFET having a source N+ region and a drain N+ region with each including a LDD region and a gate electrode with each side thereof further including an oxide film spacer and a first insulating layer formed over the gate electrode. A first conducting layer connects the source N+ region and the drain N+ region of the MOSFET to a second conducting layer for a bit line and to an inside charge storage electrode, respectively, with the first conducting layer for connecting the drain N+ region to the inside charge storage electrode being insulated from the second conducting layer by a second insulating layer. A third insulating is layer formed on the second conducting layer for the bit line; and a metal layer and a protective layer are formed on the third insulating layer.

The present invention further includes a method for manufacturing a DRAM cell having a SDHT structure comprising the steps of:

forming a P well region on a P type silicon substrate;

forming a first trench from the top of the P well region into a portion of the P well region with the first trench having a wall with an inner surface, an outer surface, a top and a bottom;

depositing a CVD oxide film layer on the inner surface of the wall and on the bottom of the first trench;

depositing a nitride layer on the CVD oxide film layer formed in the first trench;

removing a portion of the nitride and CVD oxide film layer from the bottom of the first trench to expose the P well region thereat;

forming a second trench from the exposed portion of the P well region into the P type silicon substrate with the second trench having a wall with an inner surface and outer surface;

forming a N+ diffusion region from the outer surface of the wall of the second trench into a portion of the P well region and into a portion of the P type silicon substrate;

removing the nitride formed on CVD oxide film layer on the inner surface of the wall of the first trench;

forming a capacitive oxide film layer formed on the CVD oxide film layer nd on the inner surface of the wall of the second trench;

filling the first and second trench with conducting material for a inside charge storage electrode, and planarizing the resulting top surface of the first trench;

forming an insulating oxide film layer by LOCOS technology on a portion of the top surface of the first trench and on the P well region proximate the first trench;

forming a gate electrode line on the insulating oxide film layer with an oxide film spacer at each side of the electrode line and a first insulating layer covering the gate electrode line;

forming a N MOSFET on the P well region proximate the top of the first trench, with the N MOSFET having a source N+ region and a drain N+ region with each including a LDD region and a gate electrode with an oxide film spacer formed at each side and a first insulating layer covering the gate electrode;

forming a connecting means for electrically connecting the source N+ region and the drain N+ region of the MOSFET to a second conducting layer for a bit line and inside charge storage electrode respectively by depositing a first conducting layer, a second insulating layer on a porion of the entire surface, a second conducting layer on the entire surface;

forming a third insulating layer on the second conducting layer for the bit line; and forming a metal layer on a portion of the third insulating layer and then forming a protective layer on the third insulating layer and the metal layer.

Preferably, the method for forming the N+ diffusion region by comprises the steps of:

depositing an impurity dopant source on the nitride deposited on the CVD oxide film layer formed on the inner surface of the wall of the first trench, and on the inner surface of the wall of the second trench to the desired thickness;

forming the N+ diffusion region on the outer surface of the wall of the second trench by heat treatment of the impurity dopant source; and removing the impurity dopant source from the first and second trench.

Preferably, the method for forming the MOSFET and the connecting means utilize a self-aligned contact process which comprises the steps of:

sequentially depositing a gate oxide film layer, a conducting material for gate electrode, a first insulating layer and a nitride film layer on the P type silicon substrate on which a P well region is formed;

etching the conducting material for gate electrode, the first insulating layer and the nitride film layer by a mask patterning process;

forming a LDD region by the ion implantation process after growing an oxide film layer at left and right sides of the gate electrode;

forming oxide film spacers by anisotropic etching process after forming an oxide film at the left and right sides of the gate electrode, and removing the nitride film layer;

depositing a first conducting layer containing an impurity on the entire surface, and removing a portion of the first conducting layer deposited on the first insulating layer on the gate electrode, thereby connecting the inside charge storage electrode to a drain N+ region to be formed later;

forming the source N+ region and the drain N+ region by diffusing the impurity contained in the first conducting layer into the P well region by heat treatment;

forming a second insulating layer on the entire surface, and removing a portion of the second insulating layer formed on the first conducting layer on the source N+ region; and depositing a second conducting layer for the bit line on the second insulating layer and the first conductive layer, where a portion of the second insulating layer has been removed, thereby connecting the source N+ region to the second conducting layer.

DETAILED DESCRIPTION

Figure 1:
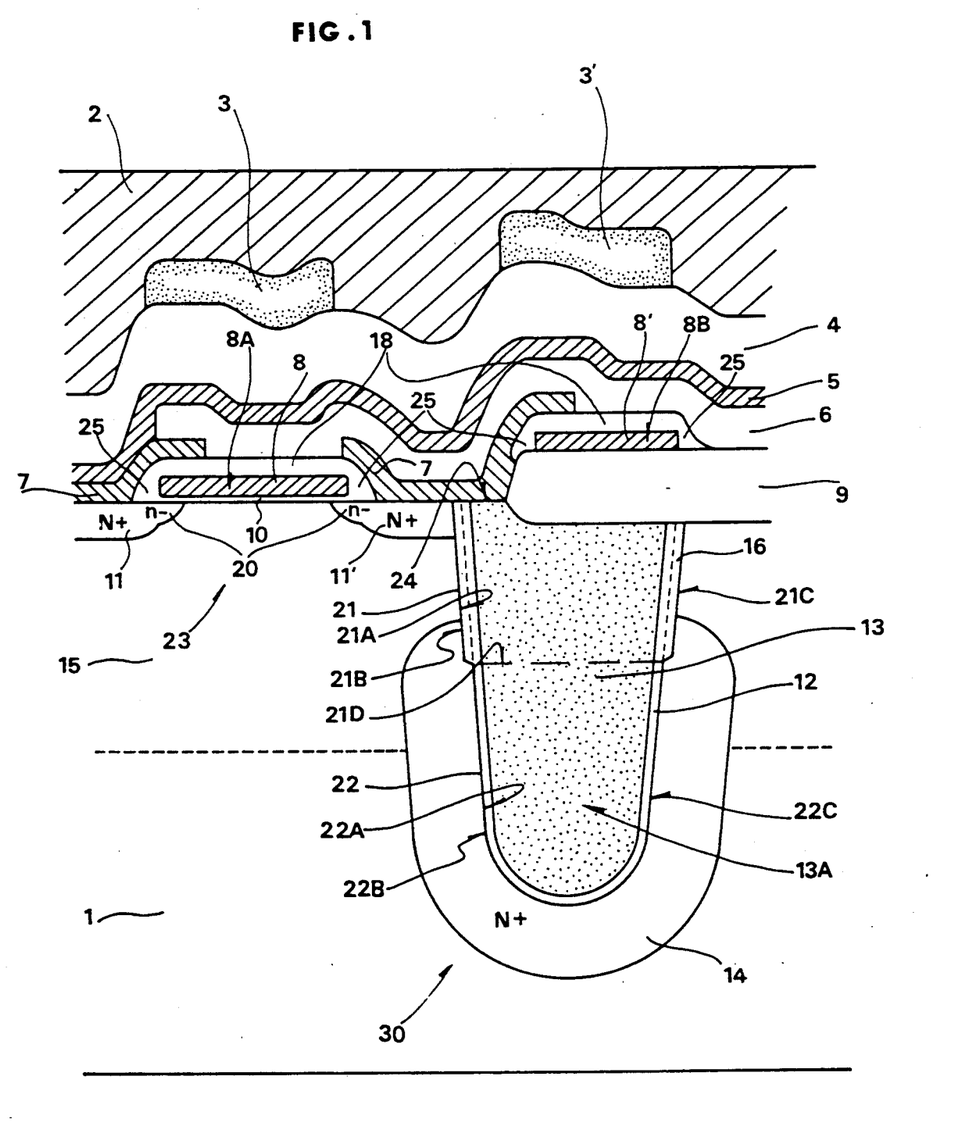
FIG. 1 illustrates a cross-section of a DRAM cell having a SDHT (Side Wall Doped Half-Vcc Plate Trench Capacitor) structure.
Figure 1A:
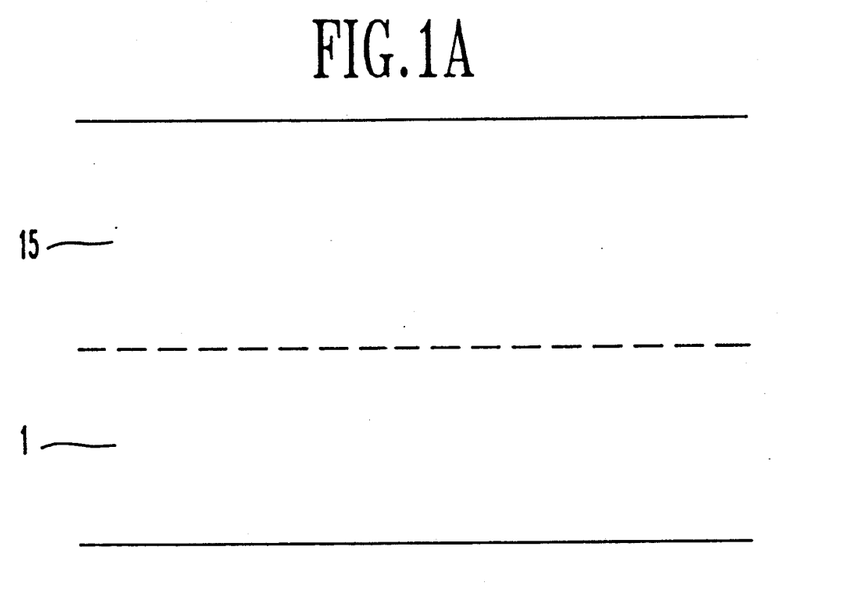
FIGS. 1A–1L illustrate manufacturing a DRAM having a SDHT structure.

FIG. 1 illustrates a cross-section of the DRAM cell with a SDHT structure. In order to execute the CMOS process, thereby reducing the power consumption of the highly integrated semiconductor device, a P Well region 15 (or N Well region) is formed on a P type silicon substrate 1 as seen in FIG. 1A.

Figure 1B:
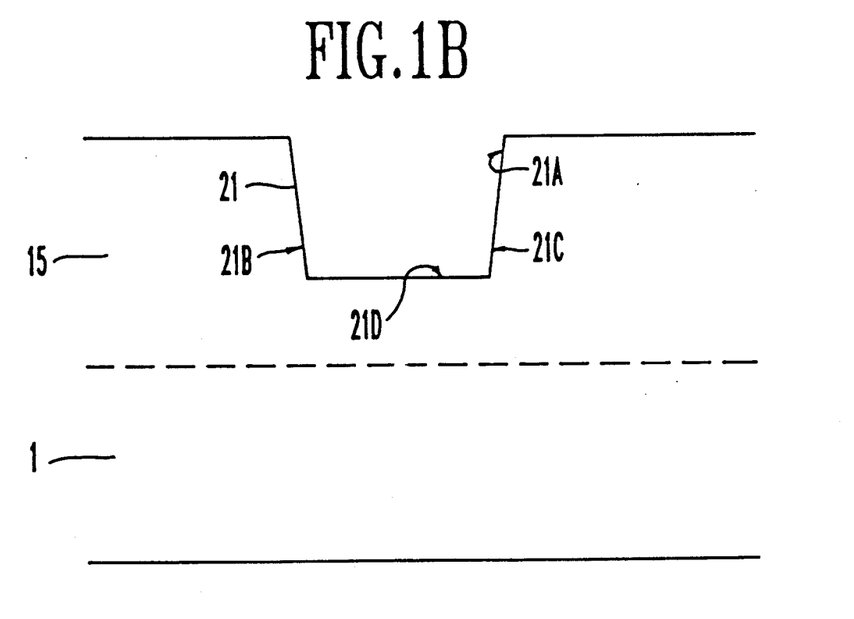

In order to form a trench capacitor 30, a mask pattern is formed on the P Well region 15, the first trench 21 is formed, for example to a 2 μm depth, into the P Well region 15 by the known RIE (Reactive Ion Etching) technology as seen in FIG. 1B.

Figure 1C:
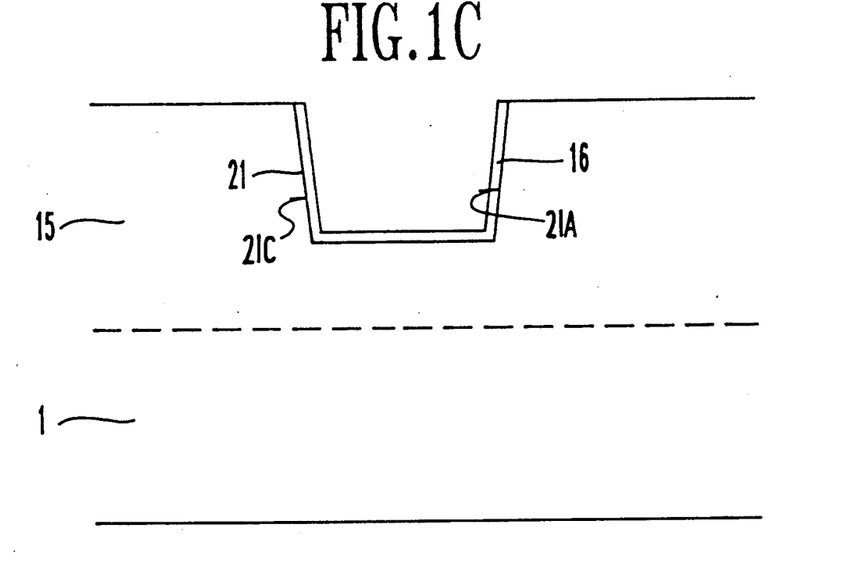

Thereafter, a CVD oxide film layer 16 is deposited, for example 1000 Angstrom, on the inner 21A wall 21C of the first trench 21 as seen in FIG. 1C.

Figure 7:
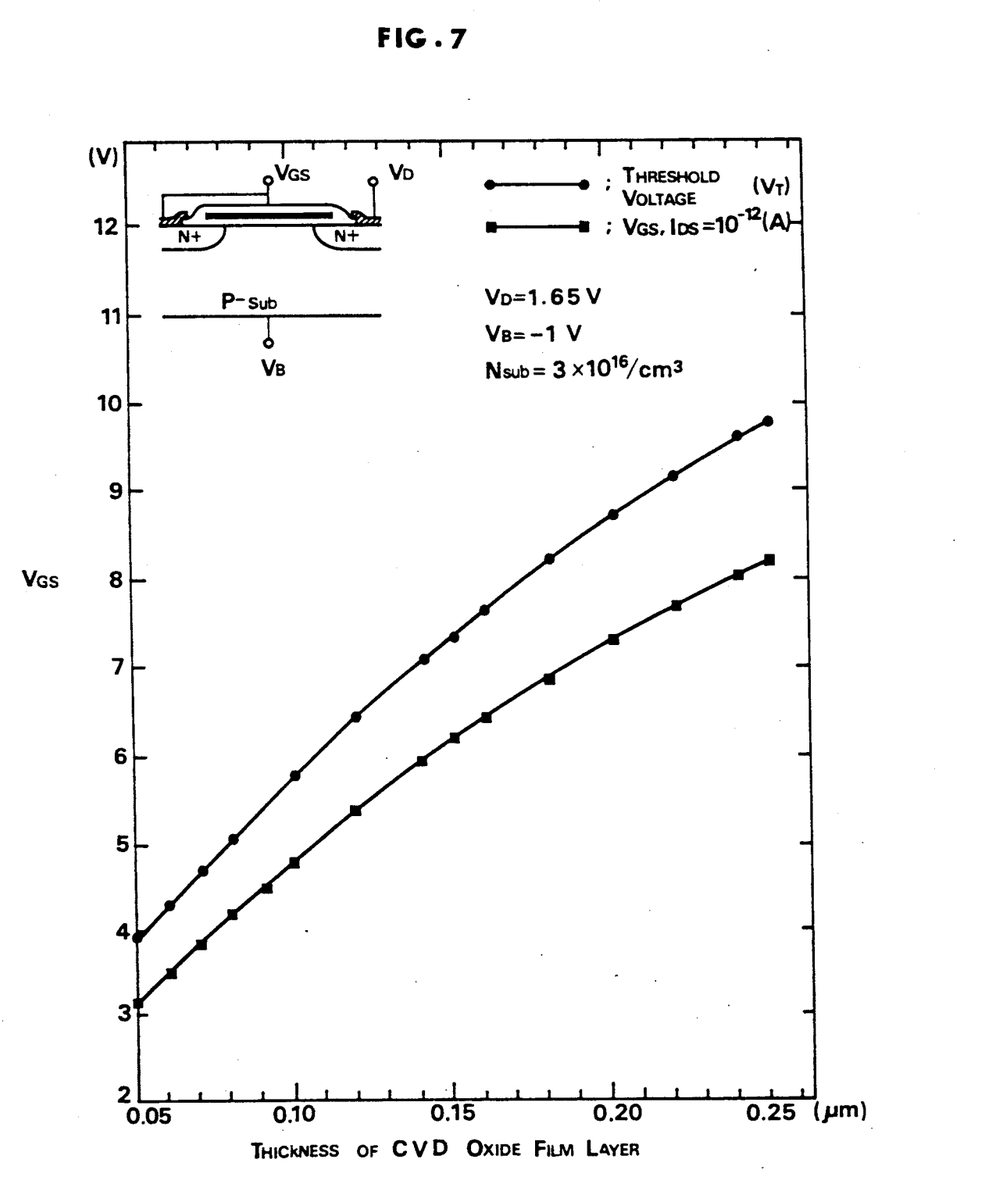
FIG. 7 illustrates the charges in threshold voltage over the thickness of the CVD oxide film layer of the trench capacitor according to the present invention.

It is noted that if the inside charge storage electrode 13A of the trench capacitor 30 is charged, so that a parasitical vertical N-MOSTET is formed between the drain N+ region 11 of the MOSFET 23 and N+ diffusion region 14 formed in the trench 21, the charge leaks from drain N+ region 11 to N+ diffusion region 14, and when a large electric field is applied between N+ diffusion region 14 of the side wall of the trench capacitor 30 and the inner charge storage electrode 13A of trench capacitor 30, a tunneling current is formed in the N+ diffusion region 14. Thus, in order to prevent said leakage charge and to control said tunneling current and to prevent leakage current between devices, the CVD oxide film layer 16 must be thick. For example, to explain above, the relationship of the thickness of the CVD oxide film layer 16, the threshold voltage, VT, according to the voltage applied to the gate electrode, and voltage VGS between the gate electrode 8A and the source N+ region 11, in which IDS current=$10^{-12}$A, are shown in FIG. 7.

Figure 1D:
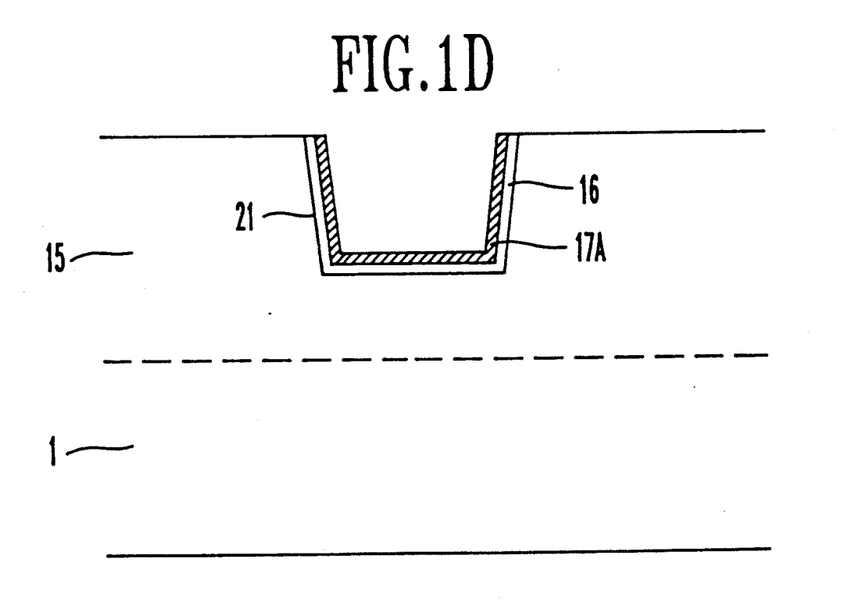
Figure 1E:
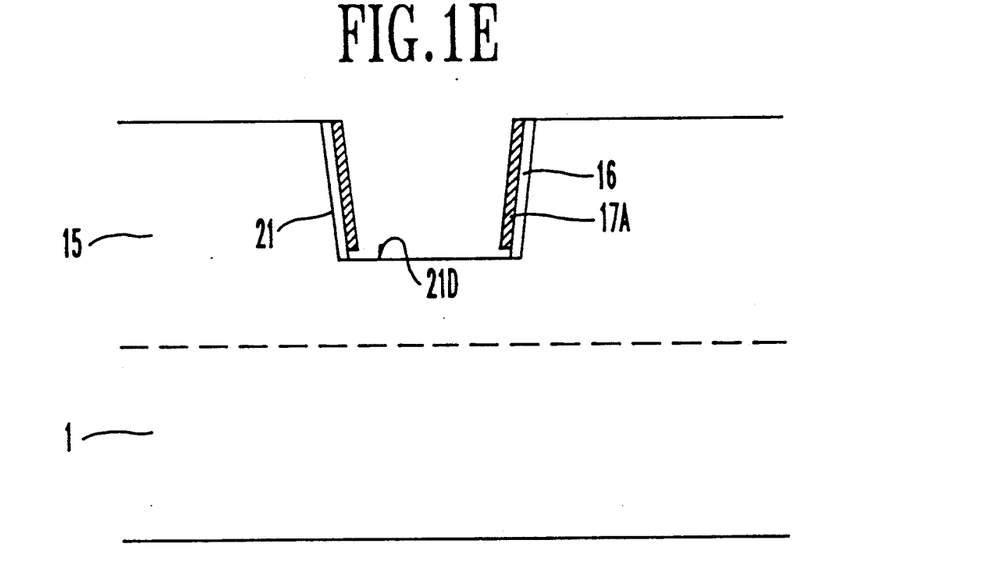

After the CVD oxide film layer 16 is deposited, a nitride film 17A is deposited, as thick as, for example, 500 Angstrom, on the CVD oxide film layer 16 in the first trench 21 as seen in FIG. 1D. The nitride film and CVD oxide film layer 16 located on a bottom 21D of the trench 21 is then removed by the known anisotropic etching technology. As result of the etching technology, the P well region 15 is exposed at the bottom 21D of the first trench 21 as seen in FIG. 1E.

Figure 1F:
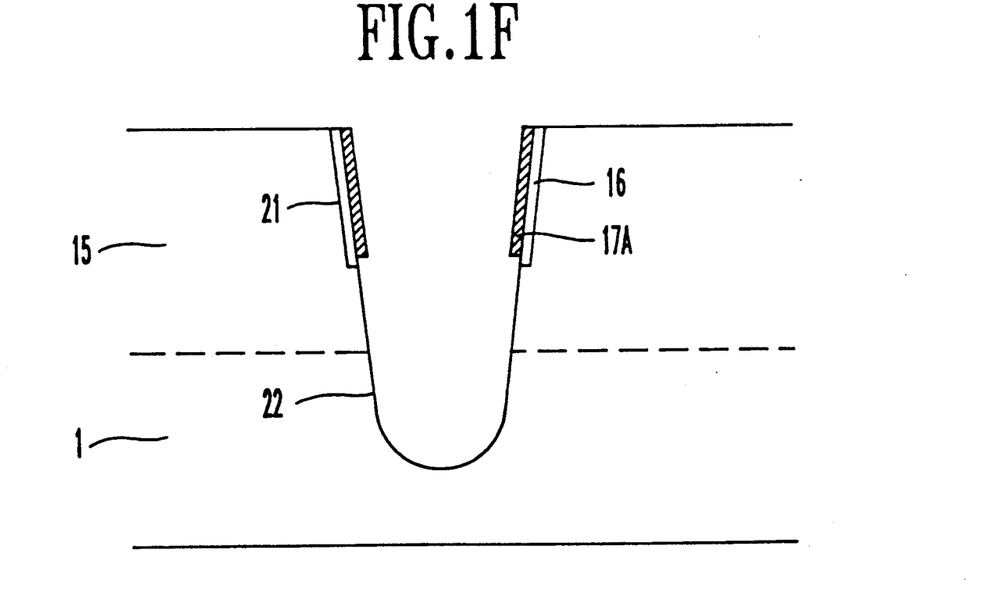
Figure 1G:
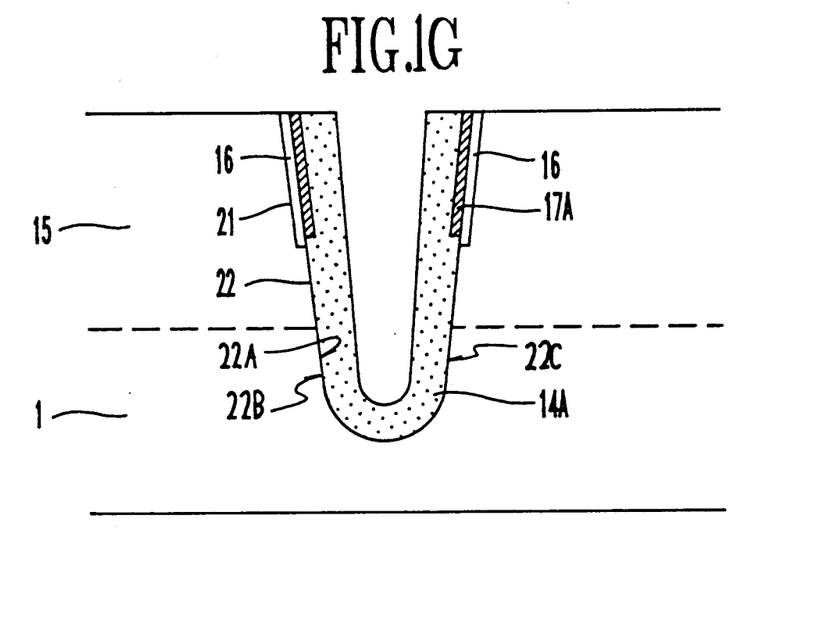
Figure 1H:
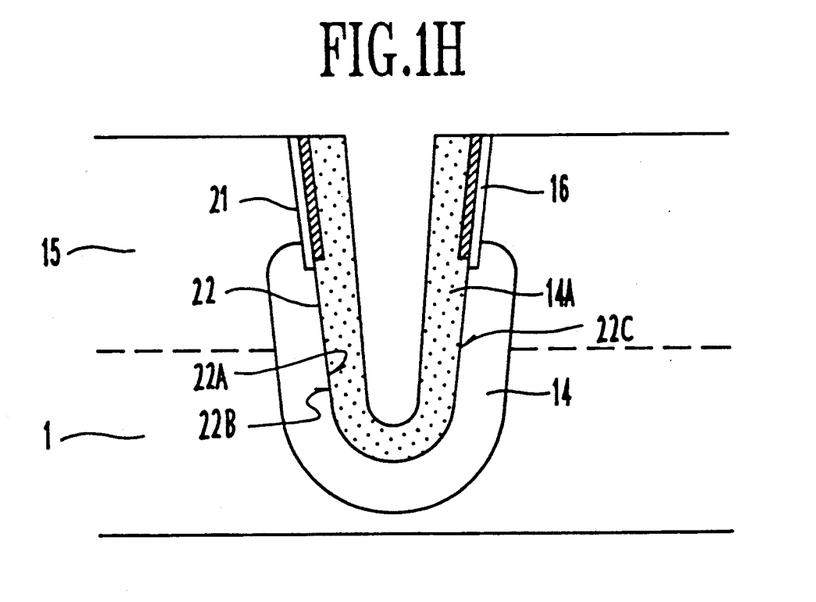
Figure 1I:
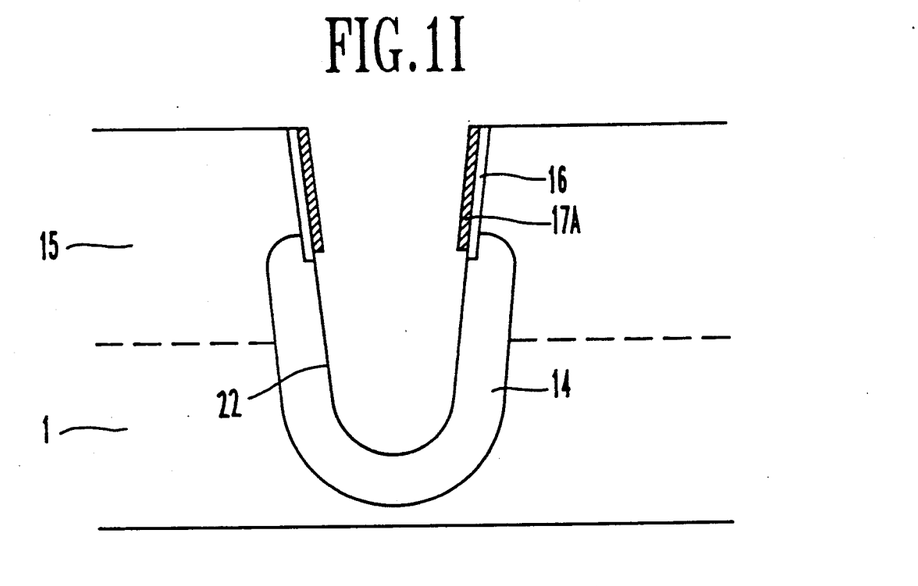
Figure 1J:
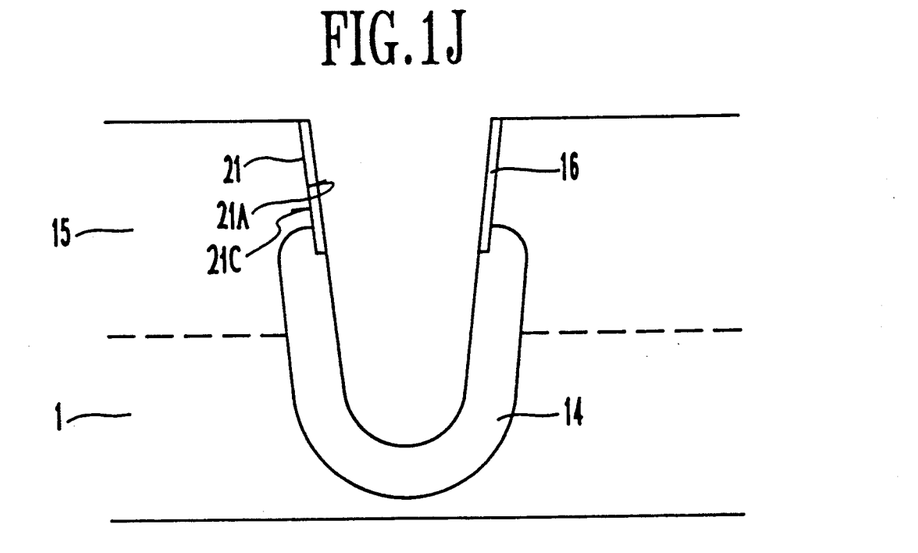

A second trench 22 is then formed, as deep as for example 5.0 micrometer, from the exposed portion of the P well region 15 into a portion of the P type silicon substrate 1 as seen in FIG. 1F. Here, the second trench 22 includes a wall 22C having a inner surface 22A and outer surface 22B. The N+ diffusion region 14 for the outside electrode of VCC/2 plate is then formed at the outer surface 22B of the wall 22C of the second trench 22 in a portion of the P well region 15 and in a portion of the P type silicon substrate 1, by using known technology. That is, a N+ impurity containing the dopant source 14A, such as PSG (phospho-Silica-Glass), is deposited both on the nitride film 17A in the first trench 21 and on the inner surface 22A of the wall 22C of the second trench 22 as seen in FIG. 1G. The dopant source is then diffused into the outer surface 22B of the wall 22C of the second trench 22, by means of the drive-in process to form a N+ diffusion region 14, as seen in FIG. 1H. After the N+ diffusion region 14 is formed, any remaining dopant source is removed as seen in FIG. 1I. The nitride film 17A formed on CVD oxide film layer 16 on the inner surface 21A of the wall 21C of the first trench 21 is removed, as seen in FIG. 1J.

Figure 1K:
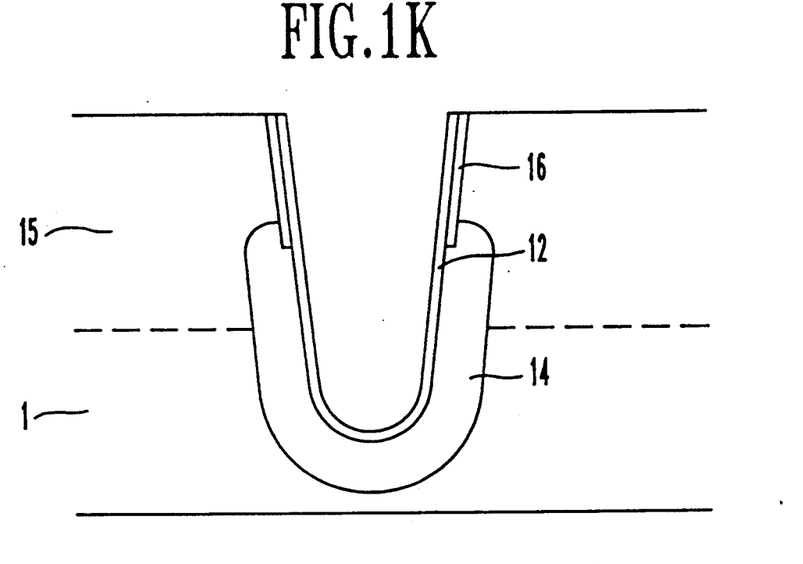

A capacitive oxide film layer 12, such as ONO layer, is formed to a thickness of, below about 100 Angstrom, on the CVD oxide film layer 16 formed on inner surface 21A of the wall 21C of the first trench 21, and on the inner surface 22A of the wall 22C of the second trench 22 as seen in FIG. 1K. It is noted that, even though it is not illustrated in the drawings, since a numerous unit cell, constituting a semiconductor device, is foldly arranged in the folded bit line cell arrangement, the semiconductor device, where the N+ diffusion regions formed at the numerous unit cell are arranged to connect each other, includes a N+ diffusion layer, at a portion of the first and second trench of the outermost trench after removing a CVD oxide film layer and capacitive oxide film layer which has been formed at the first and second trench of the outermost trench, in order to connect a plate for VCC/2 to a N+ diffusion region for outside electrode of the outermost trench capacitor.

Figure 1L:
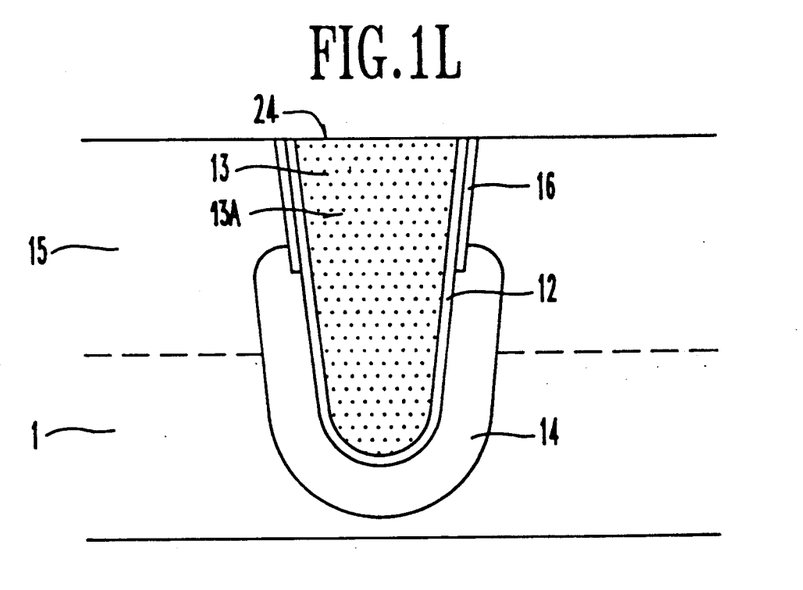

In order to form the inside charge storage electrode 13A, the first and second trench 21 and 22 are filled with a conducting material, for example N type poly material 13, and the top 24 of the first and second trench 21 and 22 is planarized by known technology as seen in FIG. 1L. An insulating oxide film layer 9 is formed, as thick as, for example, 3000 Angstrom, by known LOCOS (Local Oxidation of Silicon) technology on a portion of the top 24 of the leveled trench.

Next, after the gate oxide film 10 is grown to form the N type MOSFET 23 on the P well region 15 in the P type silicon substrate 1, the poly layer 8 and 8', which is a conducting material for the gate electrode and gate electrode line, and the LTO oxide film layer 18, which is a first insulating layer, are subsequently deposited thereon. Then, by a mask patterning process for the gate electrode, the gate electrode 8A and the gate electrode line 8B are formed, respectively. On the other hand, the LDD region 20 is formed by ion implantation in the P well region 15 near the both sides of gate electrode 8A. An oxide film layer 19 (shown in FIG. 3) is formed at the both sides of the gate electrode 8A and the gate electrode line 8B and then the oxide film spacer 25 is formed by anisotropic etching. A POLY layer 7, which is a first conducting layer, is then deposited thereover. Portions of the POLY layer 7 on the gate electrode 8A and gate electrode line 8B are removed. By heat treatment, the N+ impurity contained in the POLY layer 7 can be diffused into the P well region 15 so that the source N+ region 11 and the drain N+ region 11' are formed.

A LTO oxide film layer 6, which functions as a second insulating layer, is deposited and removed, except for the portion as shown in FIG. 1. A polycide layer 5, which is a second conducting layer for a bit line, is formed on the LTO oxide film layer 6 and on the POLY layer 7 where a portion of the LTO oxide film layer 6 has been removed, thereby connecting the source N+ region 11 to the polycide layer 5, as see FIG. 1. By depositing a doped oxide layer 4, which functions as third insulating layer, doped with BSG on the polycide layer 5 for the bit line, insulation between metal layer 3 and 3', and the polycide layer 5 for the bit line is obtained.

In case of continuously connecting the gate electrode 8A and the gate electrode line 8B which become a word line, a resistance is increased so that a signal delay is occurred. Accordingly, by forming the metal layer 3 and 3' for the word line on the doped oxide film layer 4 and contacting the metal layer 3 and 3' to the gate electrode 8A and the gate electrode line 8B every 128th cell, the occurrence of the signal delay can be avoided.

The protective layer 2 is then formed so that the DRAM cell finally manufactured can be protected from heat, shock and current. The structure manufactured by the process described above is the DRAM cell of the SDHT structure according to the present invention.

Referring to FIG. 1, the structure forming the gate electrode 8A on the gate oxide film layer 10 which is on the P well region 15, and the structure connecting the source N+ region 11 and the drain N+ region 11' of the MOSFET 23 to polycide layer 5 which is a second conducting layer for the bit line electrode and the inside charge storage electrode 13A, is formed by a self-aligned contact method in accordance with the present invention. The method will be described in detail in FIGS. 2–6.

FIGS. 2–6 illustrate a cross-sectional view which is located on the P well 15 near the trench capacitor 30.

Figure 2:
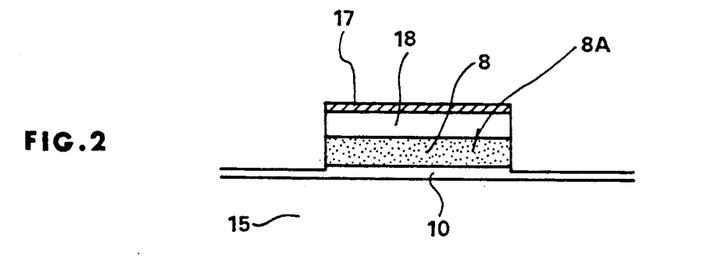
FIG. 2 illustrates a cross-section of the structure in which a gate electrode is formed during the self-aligned contact process.

FIG. 2 shows a step in which a gate oxide film layer 10 and a poly layer 8, which is a conducting material for the gate electrode 8A, are sequentially grown and deposited respectively. A LTO oxide film layer 18 as a first insulating layer is then deposited thereon. Next, in order to protect the LTO oxide film layer 18 when etching is performed and to prevent the oxide from growing in an upper direction during the oxidation process, a nitride film layer 17 is deposited on the LTO oxide film layer 18. Then only a portion of the structure described above, is formed by mask patterning process, thereby forming a gate electrode 8A.

Figure 3:
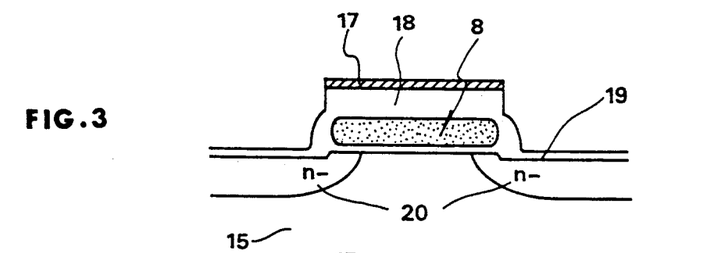
FIG. 3 illustrates a cross-section of the structure in which a oxide film is formed on the left and the right sides of gate electrode of FIG. 2 and the silicon substrate, with the LDD regions formed in the P well region.

FIG. 3 illustrates the structure of a partially completed MOSFET having an oxide film layer 19 deposited on the left and the right of the gate electrode 8A and on the P well region 15 in order to prevent a current leak which may occur between the POLY layer 7, as a first conducting layer, and the gate electrode 8A at the left and the right side of the gate electrode 8A. Also the oxide film layer 19 makes the depth of the junction of the N-impurity shallow. The LDD region 20 is formed by implanting a N-impurity. Here, in order to prevent electrons from accelerating by the strong electric field occurring when an inverse electric layer is produced at the source N+ region 11 and the drain N+ region 11', which are to be formed later, a low concentration of N− region, that is LDD region 20, is formed at a portion of the source and the drain N+ region 11 and 11', which are located near the gate electrode 8A. This reduces the strength of electric field so that it is possible to prevent the electrons from accelerating.

Figure 4:
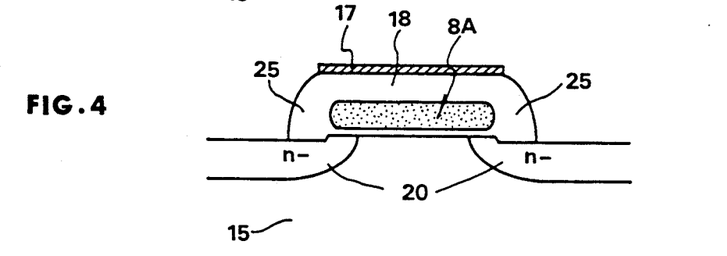
FIG. 4 illustrates a cross-section of the structure in which spacers are formed at left and right sides of the gate electrode shown in FIG. 3.

FIG. 4 illustrates a cross-section view of a partially completed MOSFET in which, after the oxide film layer 19 is formed at both sides of the gate electrode 8A, a oxide film spacer 25 is formed by anisotropic etching. The oxide film spacer 25 prevents the N+ impurity from diffusing into the LDD region 20, which is located under the gate electrode 8A, when the POLY layer 7 is heated by heat treatment.

Figure 5:
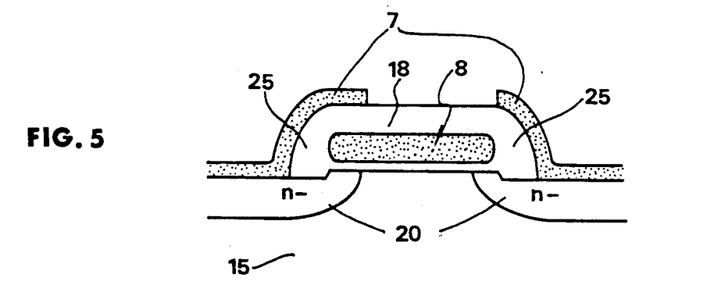
FIG. 5 illustrates a cross-section of the structure in which a POLY layer is formed on the spacer positioned at the left and right sides of gate electrode shown in FIG. 4.

FIG. 5 illustrates the structure of a partially completed MOSFET in which, after the nitride film layer 17 on the gate electrode 8A is removed, the POLY layer 7 is deposited on the LTO oxide film layer 18. The LTO oxide film layer 18 is positioned on the gate electrode 8A, and on the LDD region 20. Then, a portion of the POLY layer 7 on the gate electrode 8A is removed. At this moment, since there is no need to perform additional mask process when the IPOLY layer 7 is formed as described, a tolerance required for the mismatch of mask alignment occurring when the mask patterning process is performed as described in opening paragraph does not have to be considered.

That is, referring to FIG. 1, it is assumed that the distance between the POLY layer 7 and the left and right side of gate electrode 8A are each X, not shown, the distance between the right side of gate electrode line 8B and the POLY layer 7 is X, and the width of unit cell, which is toward the word line, is Y, not shown. Then, the area which can be reduced according the present invention is 3XY.

Figure 6:
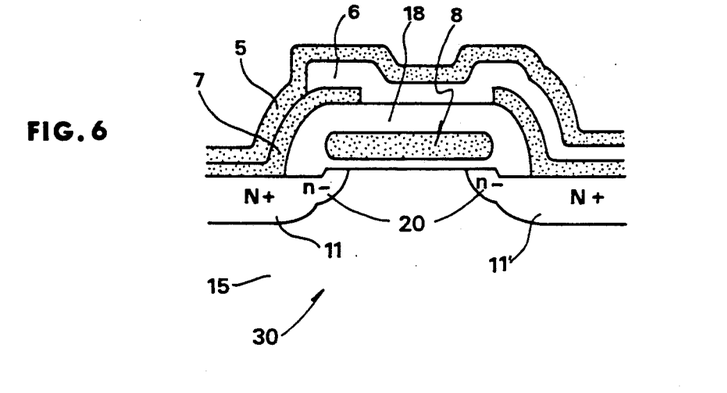
FIG. 6 illustrates a cross-section of structure in which a source and a drain N+ region are formed by a known drive-in process after the process used to prepare the structure shown in FIG. 5 and the first LTO (Low Temperature Oxidation) film layer formed on the gate electrode and a polycide layer for a bit line deposited on the POLY layer.

FIG. 6 illustrates a cross-section of a MOSFET 23 structure in which a source N+ region 11 and a drain N+ region 11' are formed by heat treatment of the POLY layer 7 shown in FIG. 5 by diffusing the impurity contained in the POLY layer 7 into P well region 15. In order to insulate the POLY layer 7 on the gate electrode 8A from the polycide layer 5, which is a second conducting layer for the bit line, a LTO layer film 6, as a second insulating layer, is deposited and then a portion thereof is removed leaving a predetermined portion as shown to expose a portion of gate electrode 8A and gate electrode line 8B. Next, a polycide layer 5, as a second conducting layer, is deposited on entire surface of the MOSFET structure, thereby connecting the poly layer 5 via POLY layer 7 to source N+ region 11 as shown.

As described above, in the present invention, the process for depositing the POLY layer 7 after formation of the gate electrode 8A, the process for forming the source N+ region 11 and the drain N+ region 11', and the process for depositing the polycide layer 5 for the bit line after deposition of the second LTO oxide film layer are performed by the self-aligned contact process.

The cell structure manufactured according to the present invention can be operable as unit DRAM cell in which a MOSFET and a trench capacitor are connected in series. That is, the gate electrode, source N+ region and drain N+ region of the MOSFET are connected to the word line, the bit line and the inside charge storage electrode of trench capacitor respectively, and the other terminal of the trench capacitor is connected to the N+ diffusion region, so that the DRAM cell which may operate storage and clear operation can be obtained. For example, in the case that a charge is strong in the trench capacitor according to the present invention, if a positive voltage applied to the bit line and to the word line respectively, the word line applies the positive voltage to the gate electrode so that the drain N+ region and the source N+ region are electrically conducted each other, and the bit line applies the positive voltage to the source N+ region so that the charge is stored via the drain N+ region in the trench capacitor.

Further, in the case that the charge is clearing in the stored trench capacitor, if a positive voltage is applied to the word line, the word line is connected to the gate electrode so that the drain N+ region and the source N+ region are electrically conducted each other, if zero voltage is applied to the bit line, a electric potential of the source N+ region is lower than that of the drain N+ region so that clearing is obtained by discharging the stored charge from trench capacitor via drain N+ region to source N+ region. Therefore, by detecting above operations, the DRAM cell which may operate storage and read of information can be achieved.

As described above, the DRAM cell comprising a SDHT structure according to the present invention has a more increased capacitance of the capacitor, and has a more decreased cell size of the DRAM cell by using the self-aligned contact process so that it is applicable in highly integrated semiconductor technologies as useful.

The forgoing description of the preferred embodiments has been presented for the purpose of illustration and description. It is not intended to limit the scope of this invention. Many modifications and variation are possible in the light of above teaching. It is intended that the scope of the invention be defined by the claims.

What is claimed is:

1. A method for manufacturing a DRAM cell having a SDHT structure comprising the steps of:

forming a P well region on a P type silicon substrate:

forming a first trench from the top of the P well region into a portion of the P well region with the first trench having a sidewall surface, and a bottom surface;

depositing a CVD oxide film layer on the sidewall surface and on the bottom surface of the first trench;

depositing a nitride layer on the CVD oxide film layer formed in the first trench;

removing a portion of the nitride layer and CVD oxide film layer from the bottom surface of the first trench to expose the P well region;

forming a second trench from the exposed portion of the P well region into the P type silicon substrate with the second trench having a sidewall surface, and a bottom surface;

depositing an impurity dopant source on the nitride layer deposited on the CVD oxide film layer formed on the sidewall surface, of the first trench, and on the sidewall surface and bottom surface of the second trench;

heating the impurity dopant source to form a N+ diffusion region from the sidewall surface and bottom surface of the second trench into a portion of the P well region and into a portion of the P type silicon substrate;

removing the impurity dopant source from the first and second trench;

removing the nitride layer formed on the CVD oxide film layer on the sidewall surface of the first trench;

forming a capacitor dielectric layer on the CVD oxide film layer and on the sidewall surface of the second trench; and filling the first and second trench with a conducting material for inside charge storage electrode, and planarizing the resulting top surface, thereby forming the inside charge storage electrode.

2. The method of claim 1 wherein the capacitive oxide film layer is formed with an Oxide-Nitride Oxide layer.

3. The method of claim 1 wherein the conducting material for the inside charge storage electrode is formed with a N type poly material.

* * * * *